United States Patent
Zhao et al.

(10) Patent No.: US 9,520,417 B2
(45) Date of Patent: Dec. 13, 2016

(54) METHOD OF MANUFACTURING ALIGNMENT FILM

(71) Applicant: Shenzhen China Star Optoelectronics Technology Co., Ltd., Guangdong (CN)

(72) Inventors: Guo Zhao, Guangdong (CN); Yu-wu Huang, Guangdong (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 14/417,661

(22) PCT Filed: Aug. 13, 2014

(86) PCT No.: PCT/CN2014/084266
§ 371 (c)(1),
(2) Date: Jan. 27, 2015

(87) PCT Pub. No.: WO2016/019594
PCT Pub. Date: Feb. 11, 2016

(65) Prior Publication Data
US 2016/0043115 A1 Feb. 11, 2016

(30) Foreign Application Priority Data

Aug. 7, 2014 (CN) .......................... 2014 1 0386256

(51) Int. Cl.
- *H01L 21/00* (2006.01)
- *H01L 27/12* (2006.01)
- *G02F 1/1333* (2006.01)
- *G02F 1/1337* (2006.01)

(52) U.S. Cl.
CPC ...... *H01L 27/1262* (2013.01); *G02F 1/133351* (2013.01); *G02F 1/133711* (2013.01); *G02F 2001/133388* (2013.01)

(58) Field of Classification Search
CPC .......................... G02F 1/1339; G02F 1/136213
USPC ........................................... 438/125
See application file for complete search history.

(56) References Cited

U.S. PATENT DOCUMENTS

| | | | | |
|---|---|---|---|---|
| 6,148,728 | A * | 11/2000 | Shin | B41N 3/006 101/424 |
| 6,538,712 | B1 * | 3/2003 | Winker | G02B 5/3016 349/117 |
| 2007/0296899 | A1 * | 12/2007 | Murade | G02F 1/1339 349/139 |

(Continued)

FOREIGN PATENT DOCUMENTS

| | | |
|---|---|---|
| CN | 102608811 | 7/2012 |
| CN | 102707508 | 10/2012 |

(Continued)

*Primary Examiner* — Trung Q Dang
*Assistant Examiner* — Patricia Reddington

(57) ABSTRACT

A method of manufacturing an alignment film is provided, and has steps of determining printing regions for an alignment agent, which including display portions and transfer portions; printing the alignment agent within the printing regions to form an alignment thin layer; and performing an alignment process to the alignment thin layer to form the alignment film. The unevenness on the edge of the alignment film is moved away from the display portions by expanding the printing regions for the alignment agent, so as to promote the imaging quality of the finished LCD.

9 Claims, 4 Drawing Sheets

(56) References Cited

U.S. PATENT DOCUMENTS

2012/0224132 A1* 9/2012 Hayama ............... G02F 1/1309
 349/153
2014/0057200 A1 2/2014 Lin et al.
2014/0071388 A1 3/2014 Liu et al.

FOREIGN PATENT DOCUMENTS

| | | |
|---|---|---|
| CN | 102768439 | 11/2012 |
| CN | 103499901 | 1/2014 |
| JP | 2003-156744 | 5/2003 |

* cited by examiner

METHOD OF MANUFACTURING ALIGNMENT FILM

CROSS REFERENCE TO RELATED APPLICATIONS

This application is a National Phase of PCT Patent Application No. PCT/CN2014/084266 having International filing date of Aug. 13, 2014, which claims the benefit of priority of Chinese Patent Application No. 201410386256.0 filed on Aug. 7, 2014. The contents of the above applications are all incorporated by reference as if fully set forth herein in their entirety.

FIELD OF THE INVENTION

The present invention relates to a liquid crystal display, and more particularly to a method of manufacturing an alignment film.

BACKGROUND OF THE INVENTION

Generally, a liquid crystal panel is composed of a color filter substrate (Color Filter, CF), a TFT array substrate (Thin Film Transistor, TFT), liquid crystal molecules (Liquid Crystal, LC), and a sealant. The working principle is that the liquid crystal molecules are controlled to change directions by applying power to the TFT substrate so that the lights from the backlight module are refracted to form the images.

During the preparation of the color filter substrate and the array substrate, it is necessary to coat the alignment agent thereon, such as the commonly used polyimide, and then the pretilt angle is further formed by rubbing or photo-etching, and thereby the liquid crystal molecules have a bearing angle.

Generally, during the process of coating a polyimide solution, first, the polyimide solution is respectively inkjet-printed onto the array substrate and the color filter substrate; next, the polyimide solution on the substrates are pre-cured for removing the solvent to uniformly form a thin film for preventing the polyimide film from the influence of the rest solvents; then, the thin film is cured to cyclize the polyamic acid (PAA) to form the polyimide film (PI), and ensure the uniformity of the film thickness to prevent mura from occurring.

As shown in FIG. 1, the array substrate 01 or the color filter substrate is coated with an alignment solution, such as a polyimide solution, and a PI film 02 is formed in accordance with a predetermined pattern. However, the positions located at the transfer portions (Au transfer pad) 03 on the array substrate 01 and the positions corresponding to the transfer portions on the color filter substrate do not need to be covered with the PI film. As shown in FIGS. 2 and 3, the PI films often have uneven and irregular thicknesses appearing around a boundary of A-A', which results in unevenness of the image display and light leakage.

As mentioned above, the design of an alignment film with an even thickness has become a major direction to develop liquid crystal display devices. Therefore, it is necessary to provide a method of manufacturing an alignment film to solve the problems existing in the conventional technology, as described above.

SUMMARY OF THE INVENTION

A primary object of the present invention is to provide a method of manufacturing an alignment film in order to even out the thickness of the alignment and to form an assembled display device with better qualities and less prone to mura.

To achieve the above objects, the present invention provides a method of manufacturing an alignment film, comprising the steps of determining printing regions for an alignment agent, wherein the printing regions include display portions and transfer portions respectively on an array substrate and a color filter substrate; printing the alignment agent within the printing regions to form an alignment thin layer; and performing an alignment process to the alignment thin layer to form the alignment film.

In one embodiment of the present invention, after the step of forming the alignment thin layer, the method further comprises a step of applying a stripping agent within the transfer portions, wherein the stripping agent is used for dissolving the alignment thin layer covered on the transfer portions; disposing gold balls at predetermined positions of the transfer portions; and combining the array substrate and the color filter substrate to conduct transparent electrode layers thereof with the gold balls.

In one embodiment of the present invention, after the step of applying the stripping agent within the transfer portions, the method further comprises a step of cleaning the transfer portions for removing the stripping agent and impurities generated during dissolving the alignment thin layer.

In one embodiment of the present invention, the method further comprises a step of forming a transparent electrode layer having a ring shape on the transfer portion when preparing the array substrate, wherein the predetermined positions are the transparent electrode layer having the gold balls disposed thereon.

In one embodiment of the present invention, the step of disposing the gold balls on the transparent electrode layer comprises steps of mixing the gold balls and a sealant, and applying the sealant mixed with the gold balls onto the transparent electrode layer.

Furthermore, the present invention provides another method of manufacturing an alignment film, comprising steps of determining printing regions for an alignment agent, wherein the printing regions are located on surfaces of an array substrate and a color filter substrate for combining with each other; printing the alignment agent within the printing regions; pre-curing the alignment agent to form an alignment thin layer; applying a stripping agent within the printing regions except display portions to carry out a stripping process; removing impurities generated by the stripping process with a cleaning process to form the alignment thin layer of the display portions; and curing the alignment thin layer and performing an alignment process to the alignment thin layer to form the alignment film.

In one embodiment of the present invention, the alignment process is rubbing alignment, UV irradiation alignment or lithographic printing alignment.

In one embodiment of the present invention, the alignment process is performed with a homogeneous parallel alignment, a homogeneous vertical alignment, a tilt alignment or a hybrid alignment.

In one embodiment of the present invention, the alignment film has a thickness ranged from 0.05 μm to 0.1 μm.

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Furthermore, if there is no specific description in the invention, singular terms such as "a", "one", and "the" include the plural number. For example, "a compound" or "at least one compound" may include a plurality of compounds, and the mixtures thereof. If there is no specific description in the invention, "%" means "weight percent (wt %)", and numerical range (e.g. 10%~11% of A) contains the upper and lower limit (i.e. 10%≤A≤11%). If the lower limit is not defined in the range (e.g. less than, or below 0.2% of B), it means that the lower limit is 0 (i.e. 0%≤B≤0.2%). The proportion of "weight percent" of each component can be replaced by the proportion of "weight portion" thereof. The abovementioned terms are used to describe and understand the present invention, but the present invention is not limited thereto.

Embodiment 1

Figure 1:
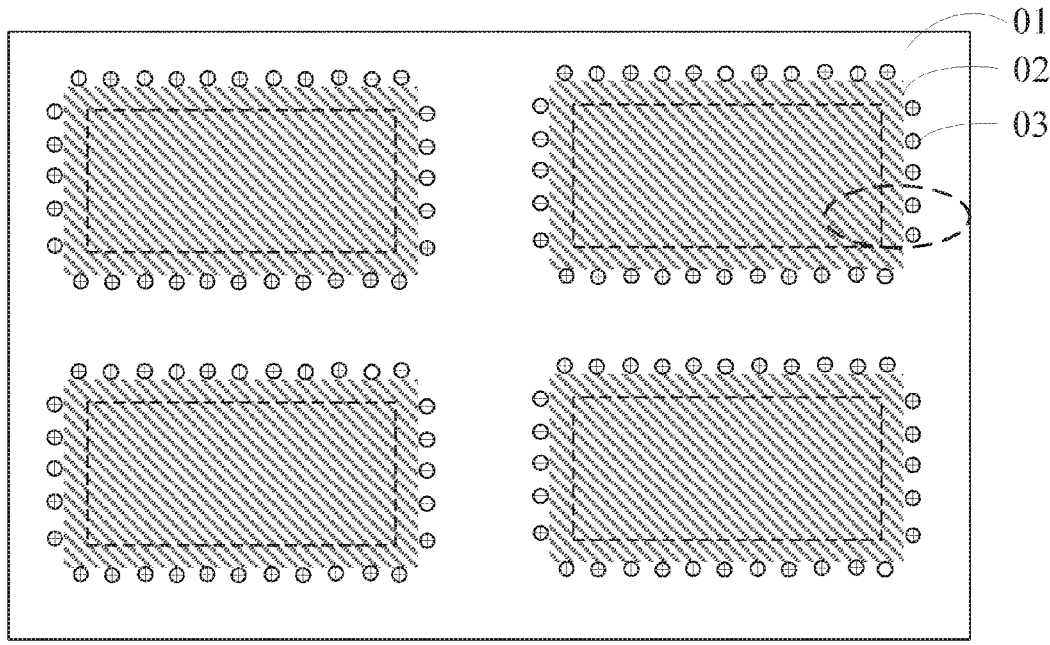
FIG. 1 is a top view of an application of a traditional alignment film according to the prior art.
Figure 2:
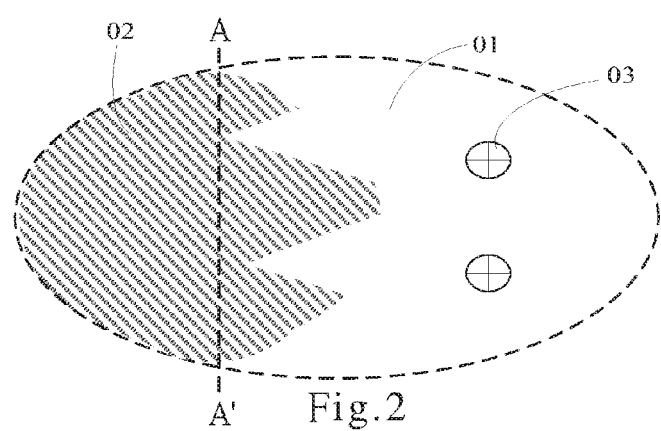
FIG. 2 is a partially enlarged top view of a traditional alignment film according to the prior art.
Figure 3:
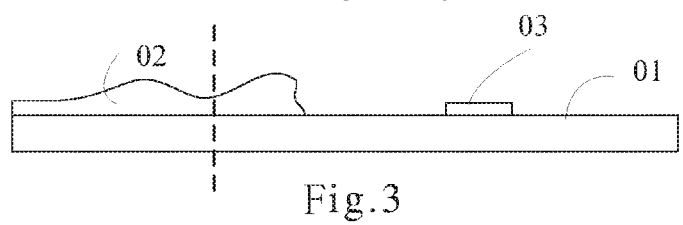
FIG. 3 is a cross-sectional view of a traditional alignment film according to the prior art, taken along a line A-A' in FIG. 2.
Figure 4:
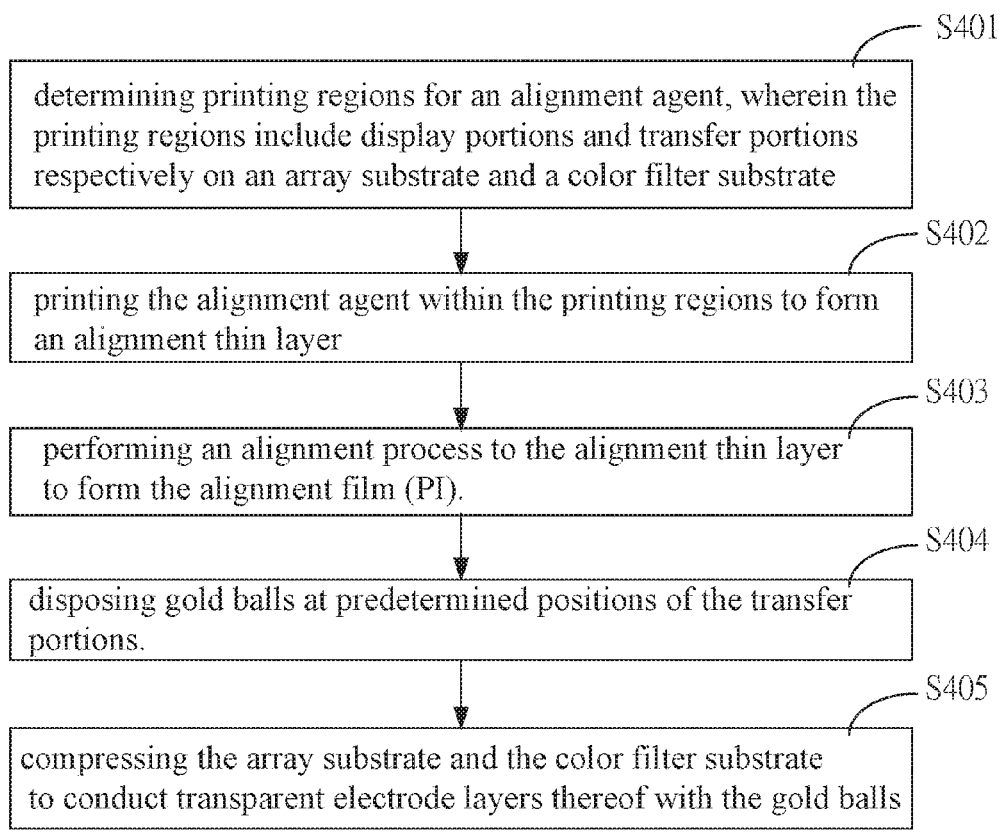
FIG. 4 shows a method of manufacturing an alignment film according to the first embodiment of the present invention.

Please refer to FIG. 4, a method of manufacturing an alignment film according to one embodiment of the present invention for providing an alignment film having an even thickness and a clear edge of display is illustrated, and comprises the following steps.

In step S401, printing regions respectively on an array substrate and a color filter substrate are determined first, wherein the printing regions include display portions and transfer portions.

Figure 5A:
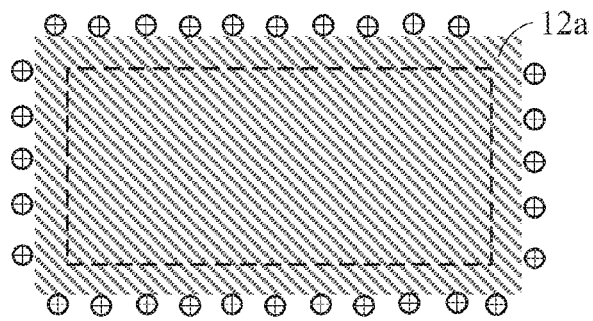
FIGS. 5A to 5B show respectively an original pattern and an expanded pattern of an alignment film according to the first embodiment of the present invention.

Conceivably, the display portions on the array substrate and the color filter substrate are used for displaying images after forming a liquid crystal panel, as shown by 12a in FIG. 5A.

Conceivably, the transfer portions surround the display portions, and a sealant is applied thereon for connecting the array substrate and the color filter substrate. In general, where a transparent electrode layer is disposed corresponds to the transfer portions on the array substrate or the color filter substrate, and electric gold balls as well as the sealant are applied on the transfer portions.

Figure 5B:
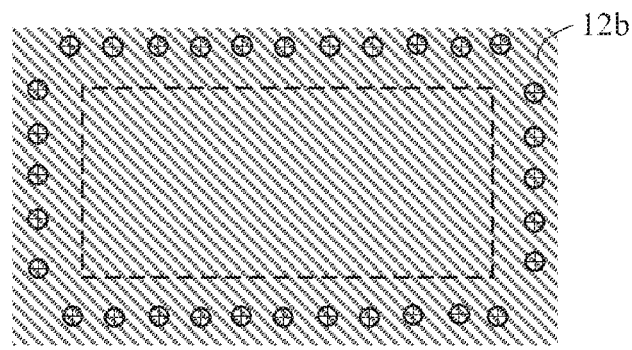

As shown in FIG. 5B, the numeral 12b is the printing regions with an expanded pattern at the edge of the display portions.

In step S402, an alignment agent is printed within the printing regions to form an alignment thin layer.

In one embodiment, the alignment agent is polyimide (PI), and forms a PI thin layer in this step.

Figure 6:
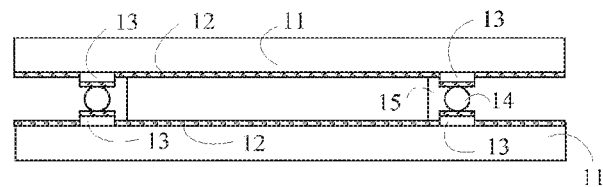
FIG. 6 is a cross-sectional view of an alignment film in a liquid crystal cell according to the first embodiment of the present invention.

In step S403, an alignment process is performed to the alignment thin layer to form the alignment film. The cross-sectional view of the alignment film is shown in FIG. 6.

Conceivably, the alignment process such as rubbing alignment, UV irradiation alignment, or lithographic printing alignment may be carried out. Generally, rubbing alignment is most commonly adopted. The alignment process is performed with a homogeneous parallel alignment, a homogeneous vertical alignment, a tilt alignment, or a hybrid alignment.

In step S404, gold balls are disposed at predetermined positions of the transfer portions.

In step S405, the array substrate and the color filter substrate are compressed to conduct transparent electrode layers (e.g. Indium tin oxide) thereof with the gold balls passing through the alignment film.

Referring now to FIG. 6, a cross-sectional view shows the alignment film before compressing the array substrate and the color filter substrate 11. The array substrate and the color filter substrate 11 have the transfer portions 13 thereon. The alignment film 12 is applied to the array substrate and the color filter substrates 11 and the transfer portions 13. The gold balls 14 are disposed on the transfer portions 13, and sealed by the sealant 15. Conceivably, the gold balls 14 pass through the alignment film 12 so that the transparent electrode layers (no shown) can be conducted after compressing.

Steps S401-S404 are the preparation of the alignment film itself, and steps S405-S406 are the preparation of the alignment film with the final form in the liquid crystal cell.

Embodiment 2

The present invention provides a method of manufacturing an alignment film for providing an alignment film having an even thickness and a clear edge of display. The method is based on the first embodiment, and has additional steps of cleaning the transfer portions between step S402 and S403. The additional steps comprise (1) applying a stripping agent within the transfer portions, wherein the stripping agent is used for dissolving the alignment thin layer covering on the transfer portions; and (2) cleaning the transfer portions for removing the stripping agent and impurities after dissolving the alignment thin layer. Thus, the uniformity of the alignment film is improved; meanwhile, the connection status between the upper and lower substrates through the gold balls can be improved. The cross-sectional structure is as shown in FIG. 7.

Figure 7:
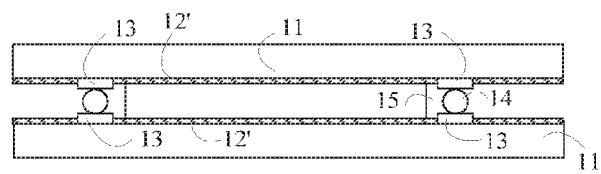
FIG. 7 is a cross-sectional view of an alignment film in a liquid crystal cell according to the second embodiment of the present invention.

Referring now to FIG. 7, the array substrate and the color filter substrate 11 have the transfer portions 13 thereon. The alignment film 12' is applied to the array substrate and the color filter substrates 11. The gold balls 14 are disposed on the transfer portions 13, and sealed by the sealant 15. Conceivably, the conductivity is better due to no alignment film 12 and other impurities on the transfer portions 13.

Furthermore, in step S406, the array substrate and the color filter substrate are combined to conduct transparent electrode layers thereof with the gold balls.

Conceivably, compared with the first embodiment, the second embodiment skips the step of "compressing so that the gold balls pass through the alignment film".

Embodiment 3

Figure 8:
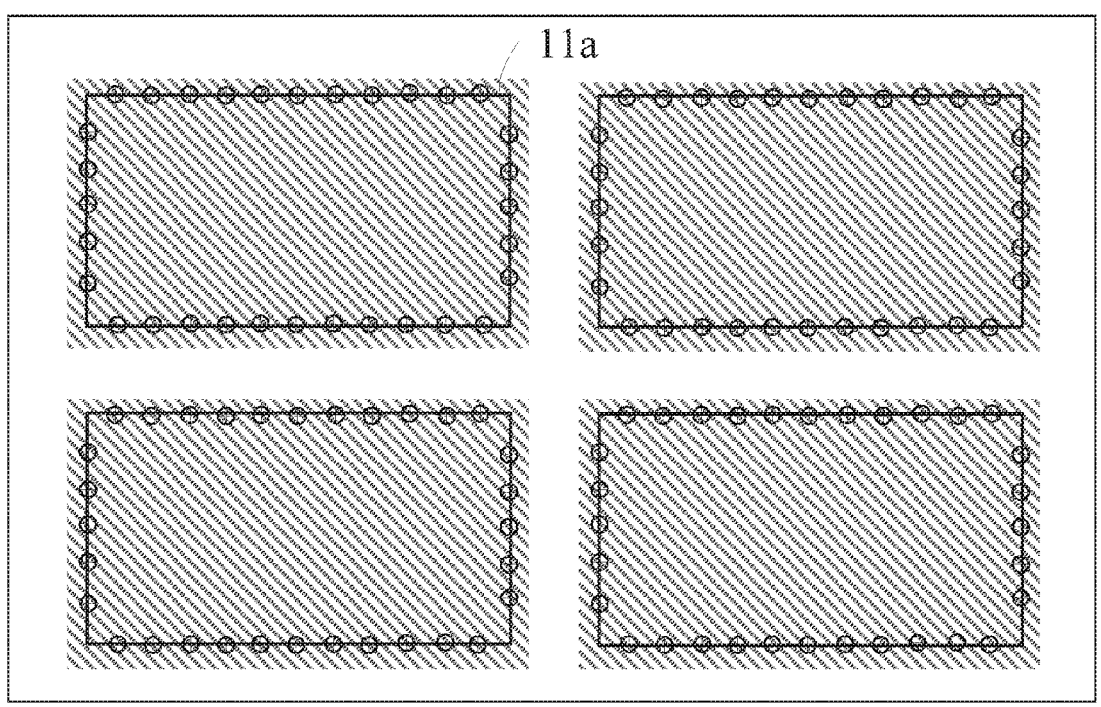
FIG. 8 is a schematic view showing a transparent electrode layer on an array substrate according to the third embodiment of the present invention.

The present invention provides a method of manufacturing an alignment film for providing an alignment film having an even thickness and a clear edge of display. The method is based on the first embodiment, and has additional steps of (1) forming a transparent electrode layer having a ring shape on the transfer portion surrounding the display portion for improving the conductivity of the upper and lower substrates through the gold balls when preparing the array substrate, wherein the transparent electrode layer having a ring shape is shown as 11a in FIG. 8; and (2) mixing the sealant with the gold balls and applying on the transparent electrode layer having a ring shape. In step (2), the gold balls uniformly disperse in the sealant so that the chance of passing through the alignment film can be greatly raised, and the conductivity of the upper and lower substrate can be improved. The cross-sectional structure is as shown in FIG. 9.

Figure 9:
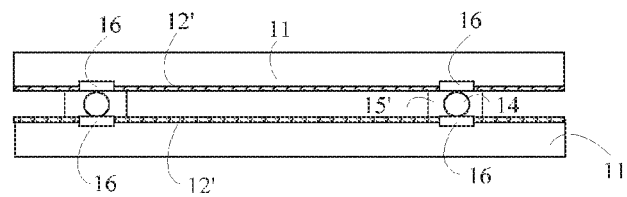
FIG. 9 is a cross-sectional view of an alignment film in a liquid crystal cell according to the third embodiment of the present invention.

In FIG. 9, transparent electrode layers (e.g. Indium tin oxide) are disposed on the array substrate and the color filter substrate 11. The alignment film 12' is applied on the array substrate and the color filter substrates 11. The gold balls 14 are uniformly dispersed in the sealant 15' and applied for shortening the process time. Conceivably, the abovementioned two steps can be performed alternatively or both, thereby improving the conductive effect of the gold balls between the upper and lower substrates in different manners. Unlike the traditional ways that the gold balls, the transfer portions, and the impurities possibly thereon are ignored, the present invention pays more attention to details so that the defects such as light leakage do not occur.

Embodiment 4

Figure 10A:
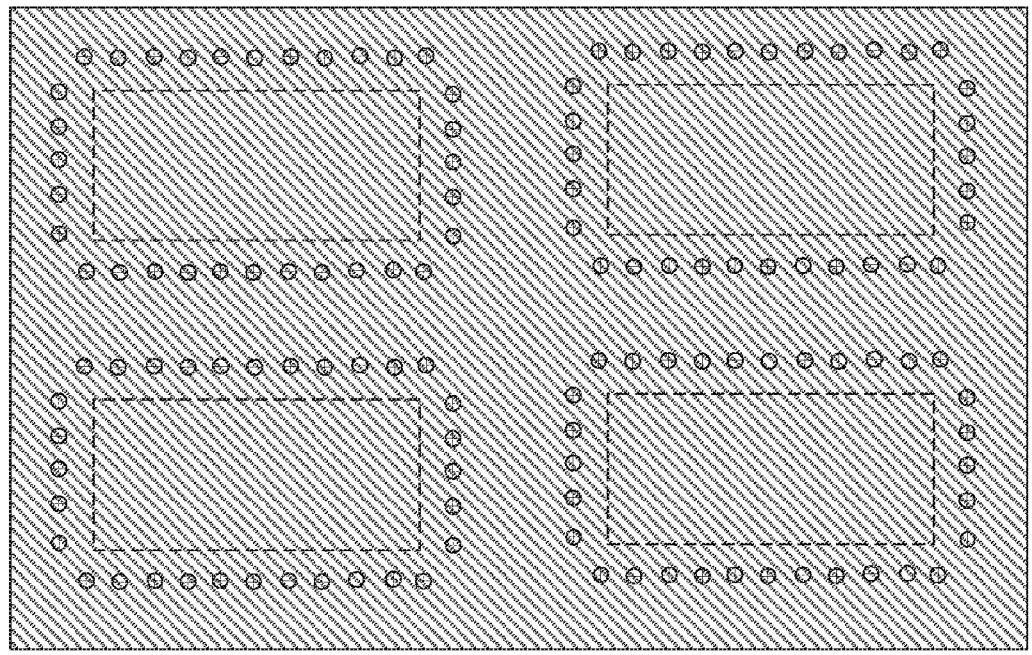
FIGS. 10A to 10B show respectively an original pattern and an expanded pattern of an alignment film according to the fourth embodiment of the present invention.
Figure 10B:
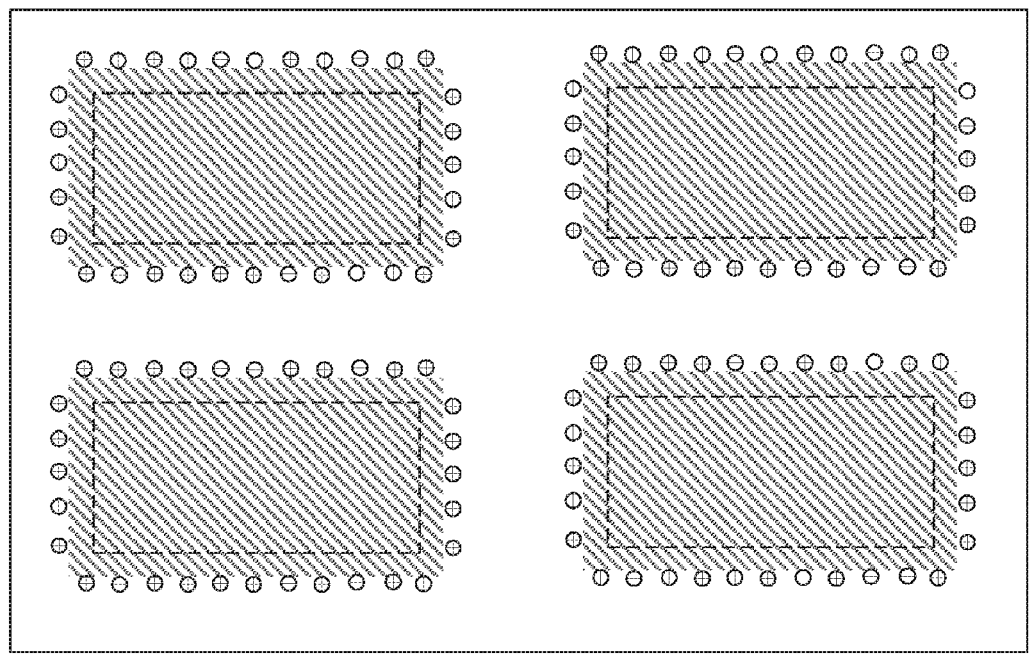

The present invention provides a method of manufacturing an alignment film for providing the alignment film having an even thickness and a clear edge of display. The method comprises the steps of (1) determining printing regions respectively on an array substrate and a color filter substrate, wherein the printing regions are located on surfaces used for combining the array substrate and the color filter substrate; (2) printing an alignment agent within the printing regions to form an alignment thin layer, as shown in FIG. 10A, i.e., the alignment agent covers the entire surface of the substrate; (3) pre-curing the alignment agent to form an alignment thin layer; (4) applying a stripping agent within the printing regions except display portions to carry out a stripping process; (5) removing impurities generated by the stripping process with a cleaning process to form the alignment thin layer of the display portions, as shown in FIG. 10B; and (6) curing the alignment thin layer and performing an alignment process to the alignment thin layer to form the alignment film.

Conceivably, an alignment process such as rubbing alignment, UV irradiation alignment, or lithographic printing alignment may be carried out. Generally, rubbing alignment is most commonly adopted. The alignment process is performed with a homogeneous parallel alignment, a homogeneous vertical alignment, a tilt alignment, or a hybrid alignment.

In this embodiment, the prepared alignment film with a thickness in the range of 0.05 μm to 0.1 μm has an even thickness and a clear display edge. The display device assembled by the alignment film according to the present invention has the advantages of high image quality and less light leakage.

The present invention provides an alignment film with an improved uniformity. In addition, the second and third embodiments have the benefit of conducting the transparent electrode layer of the upper and lower substrates through the gold balls and shortening the process time by cleaning and the design of the gold balls.

The present invention has been described with preferred embodiments thereof and it is understood that many changes and modifications to the described embodiments can be carried out without departing from the scope and the spirit of the invention that is intended to be limited only by the appended claims.

What is claimed is:

1. A method of manufacturing an alignment film, comprising steps of:
   determining printing regions for an alignment agent, wherein the printing regions include display portions and transfer portions respectively on an array substrate and a color filter substrate;
   printing the alignment agent within the printing regions to form an alignment thin layer;
   after the alignment thin layer is formed, applying a stripping agent within the transfer portions, wherein the stripping agent is used for dissolving the alignment thin layer covered on the transfer portions;
   after the alignment thin layer covered on the transfer portions is dissolved, cleaning the transfer portions for removing the stripping agent and impurities generated during dissolving the alignment thin layer; and
   after cleaning the transfer portions, performing an alignment process to the alignment thin layer to form the alignment film.

2. The method according to claim 1, further comprising steps of:
   disposing gold balls at predetermined positions of the transfer portions on the array substrate or the color filter substrate; and
   compressing the array substrate and the color filter substrate to conduct transparent electrode layers thereof with the gold balls passing through the alignment film.

3. The method according to claim 1, wherein
   after the step of forming the alignment film, further comprising steps of:
   disposing gold balls at predetermined positions of the transfer portions; and
   compressing the array substrate and the color filter substrate to conduct transparent electrode layers thereof with the gold balls.

4. The method according to claim 2, further comprising a step of:
   forming a transparent electrode layer having a ring shape on the transfer portions when preparing the array substrate,
   wherein the predetermined positions are the transparent electrode layer having the gold balls disposed thereon.

5. The method according to claim 4, wherein the step of disposing the gold balls on the transparent electrode layer comprises steps of:
   mixing the gold balls and a sealant; and
   applying the sealant mixed with the gold balls onto the transparent electrode layer.

6. A method of manufacturing an alignment film, comprising steps of:

determining printing regions for an alignment agent, wherein the printing regions are located on surfaces an array substrate and a color filter substrate for combining with each other;

printing the alignment agent within the printing regions;

pre-curing the alignment agent to form an alignment thin layer;

after the alignment thin layer is formed, applying a stripping agent within the printing regions except on display portions to carry out a stripping process, wherein the stripping agent is used for dissolving the alignment thin layer covered on the transfer portions;

after the alignment thin layer covered on the transfer portions is dissolved, removing impurities generated by the stripping process with a cleaning process to form the alignment thin layer of the display portions;

after the cleaning process, curing the alignment thin layer; and performing an alignment process to the alignment thin layer to form the alignment film.

7. The method according to claim 6, wherein the alignment process is rubbing alignment, UV irradiation alignment, or lithographic printing alignment.

8. The method according to claim 6, wherein the alignment process is performed with a homogeneous parallel alignment, a homogeneous vertical alignment, a tilt alignment, or a hybrid alignment.

9. The method according to claim 8, wherein the alignment film has a thickness ranged from 0.05 µm to 0.1 µm.

\* \* \* \* \*